Oct. 24, 1972 K. R. NEWBY ET AL 3,700,569

METHOD OF METALLIZING DEVICES

Filed Sept. 10, 1971 2 Sheets-Sheet 1

Oct. 24, 1972 K. R. NEWBY ET AL 3,700,569

METHOD OF METALLIZING DEVICES

Filed Sept. 10, 1971 2 Sheets-Sheet 2

United States Patent Office 3,700,569
Patented Oct. 24, 1972

3,700,569
METHOD OF METALLIZING DEVICES

Kenneth Russ Newby, Murray Hill, and Dennis Robert Turner, Chatham Twp., Morris County, N.J., assignors to Bell Telephone Laboratories, Incorporated, Murray Hill, Berkeley Heights, N.J.

Filed Sept. 10, 1971, Ser. No. 179,287
Int. Cl. C23b *5/48, 5/46*
U.S. Cl. 204—15 8 Claims

ABSTRACT OF THE DISCLOSURE

In the fabrication of devices, as, for example, semiconductor devices of the beam lead type, one technique employed to metallize electrode surfaces is to electrodeposit a layer of gold onto a previously deposited layer of platinum, which in turn has been deposited on a layer of titanium. A photoresist layer, deposted directly on the platinum layer, is used to define regions to be gold plated to form electrode contacts and interconnective patterns. Oxidation, preferably by anodizing, of the platinum layer prior to the deposition of the photoresist layer increases the adherence of the photoresist layer. The increased adherence significantly reduces underplating of the photoresist layer during the electrodeposition of the gold layer and results in improved definition of the gold electrode surface.

BACKGROUND OF THE INVENTION

(1) Field of the invention

The invention deals with the metallization of devices, including integrated circuits, where masking is employed to define regions of contacts and interconnections. In particular, deposition of gold onto limited regions of a platinum surface is described.

(2) Description of the prior art

In the fabrication of devices, metallization of electrode surfaces may be accomplished by electrodepositing a layer of gold onto a previously deposited layer of platinum. The platinum layer may, in turn, be deposited on a substrate, such as, for example, titanium. An organic film photoresist mask, deposited directly on the platinum layer, is employed to define regions to be gold plated to form electrode contacts and interconnective patterns. However, a problem often encountered during the electrodeposition of gold is imprecise definition of the gold electrode surface as a result of underplating; that is, the gold is not restricted to those areas defined by the photoresist pattern, but rather extends underneath the photoresist. This underplating occurs due to poor adherence of the photoresist layer to the platinum layer.

The prior art of metallizing silicon integrated circuit devices described by M. P. Lepselter (U.S. Pat. No. 3,287,612, dated Nov. 22, 1966) teaches that in making contact to silicon, the entire surface is oxidized and holes are then etched through the silicon oxide layer to the underlying silicon. Next, titanium is deposited onto the entire surface, since gold or silver, the metals ultimately required for connecting the device to external circuitry, do not adhere as well to silicon dioxide as does titanium. Following deposition of titanium, a layer of platinum is deposited directly over titanium. This is often done, since gold, which is usually the metal employed to connect the device to external circuitry, tends to form brittle alloys with titanium. At this stage in the process, it is convenient to mask the entire platinum surface with an organic film protoresist and, practicing well-known photoresist techniques, to define and open up conductive and interconnective paths on the platinum surface. Gold is then electrodeposited only on the exposed platinum regions. Finally, the remaining portions of the photoresist and of platinum and titanium are removed, either by chemical dissolution or, in the case of platinum, by back-sputtering. (Since the gold layer is nearly ten times as thick as the platinum layer, back-sputtering does not remove a significant amount of gold.)

A problem often encountered, however, is that there is a limitation on the definition of the gold electrode surfaces, because the photoresist film does not adhere well to platinum. Only in recent years has this problem become important, where a reduction of circuit dimensions to accommodate high frequency applications has necessitated closer placement of contact surfaces and a higher packing density of devices on circuit chips. As a result of the poor adherence of the photoresist to platinum, underplating of gold may occur. The close physical placement of conducting surfaces means that adjacent conductors may be short-circuited by the extension of the gold plating from one conducting surface to the next.

Proposals have been advanced to solve this problem. One disclosure, by J. A. Wenger (U.S. Pat. No. 3,507,-756, dated Apr. 21, 1970) teaches the deposition of a layer of titanium onto the platinum surface. This layer will readily oxidize in air at ambient temperatures to produce a thin layer of titanium oxide ($TiO_2$). The photoresist is relatively adherent to this titanium oxide layer, and there is less underplating of the photoresist layer by the electrodeposition of gold than if the photoresist were applied directly to the platinum surface. However, both the titanium and the titanium dioxide layers must be etched before the gold layer can be deposited.

Alternatively, a disclosure by RCA (British Pat. No. 1,211,657, dated Nov. 11, 1970) teaches the deposition of a layer of silicon onto the platinum surface. Following oxidization of this layer of silicon, the photoresist is applied to the silicon dioxide surface, and again the photoresist is adherent. However, again, both the silicon and silicon dioxide layers must be etched before the gold layer can be deposited.

SUMMARY OF THE INVENTION

In accordance with the invention, improved mask adhesion to platinum, and therefore a more precise definition of the electrodeposited gold layer, is achieved by oxidizing the platinum surface and applying the photoresist to the platinum oxide layer thus formed. The photoresist is quite adherent, and there is no appreciable underplating of gold during the electrodeposition of gold. The exposed platinum oxide where gold is to be deposited need not be removed in a separate step prior to the deposition of gold, since in any gold electrodeposition procedure used, exposed platinum oxide is inherently reduced to metallic platinum before electrodeposition of gold begins. Removal of the photoresist, platinum oxide, platinum, and titanium layers lying outside the regions on which gold has been deposited is then easily accomplished by methods well known in the art of metallizing devices.

The platinum oxide layer is formed either by anodic oxidation or by chemical oxidation in a strong oxidant. For the sake of convenience, anodic oxidation is preferred.

It will be readily apparent to the practitioner that the inventive concept will apply to the metallization of a broad diversity of devices, including integrated circuits, capacitors, and resistors.

DETAILED DESCRIPTION OF THE INVENTION

(1) The drawing

Figure 1:
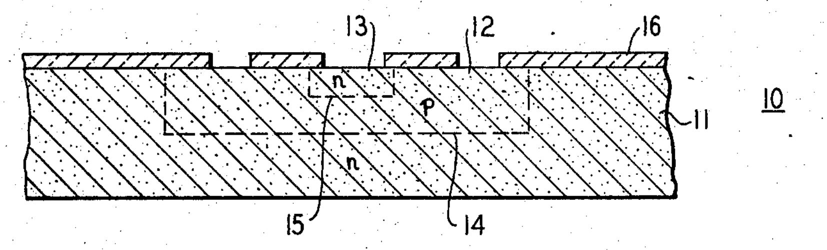
FIGS. 1–6 depict, in cross-section, a portion of a device, here a semiconductor slice, including a transistor configuration, as it is processed for the formation of contacts and interconnections in accordance with the invention.

FIG. 1 illustartes an example of a semiconductor device in which the body 10 is a portion of a semiconductor slice from which an array of semiconductor devices is fabricated. By previous processing steps using well-known masking and diffusion techniques, conductivity-type zones 12 and 13 corresponding to base and emitter, respectively, have been made. These zones are defined by boundary layers 14 and 15. A masking layer 16 of silicon dioxide ($SiO_2$) is formed on the surface of the body to define contact areas for providing electrodes to the p-type base region 12 and the n-type emitter region 13.

The description of the metallization procedure that follows is generally in accord with that taught by Lepselter, as noted above, but with the modifications introduced by the present invention. The purity of all metals described is that found in normal commercial practice.

Figure 2:
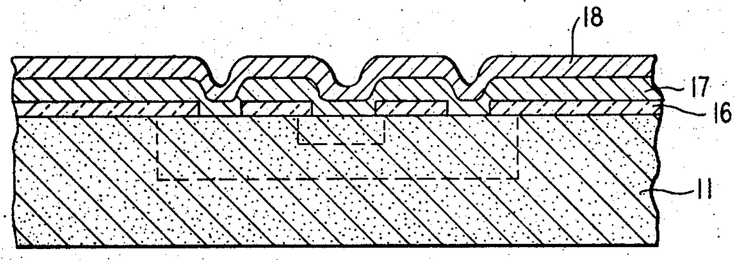

As shown in FIG. 2, a layer 17 of titanium (about 0.15 to 0.3 micrometer) is deposited on the entire surface of the body 10, since it forms an adherent bond to the oxide surface 16. Following deposition of the titanium layer 17, a second metallic layer 18 of platinum (about 0.15 to 0.3 micrometer) is deposited on the entire surface. Both the titanium and the platinum depositions are conveniently performed by well-known vacuum deposition techniques, such as sputtering or electron-gun vacuum evaporation.

Figure 3:
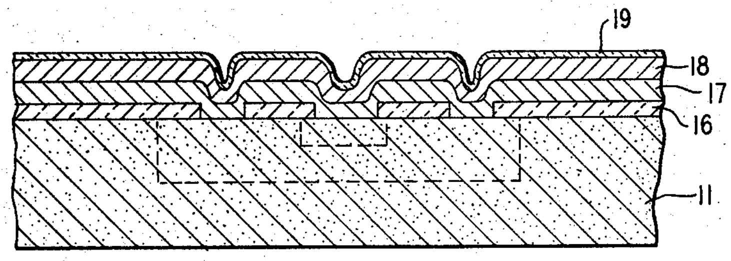

In accordance with the invention and departing from the prior art, the platinum layer 18 is oxidized to form a layer 19 of platinum oxide, shown in FIG. 3. The oxidation may be accomplished anodically in any number of electrochemical solutions known to oxidize platinum. Aqueous sulfuric acid is one such solution that may be used. As described in further detail below, an oxide layer is formed over the entire platinum surface by applying either a voltage of from 0.8 to 1.6 volts for at least ten seconds or a current density of from 0.1 to 10 milliamperes per square centimeter until at least 0.8 volt is attained. Alternatively, the oxidation may be accomplished chemically in a number of strong chemical oxidants. Hot (at least 70° C.) concentrated (70% by volume) nitric acid ($HNO_3$) is one such oxidant that may be used.

Figure 4:
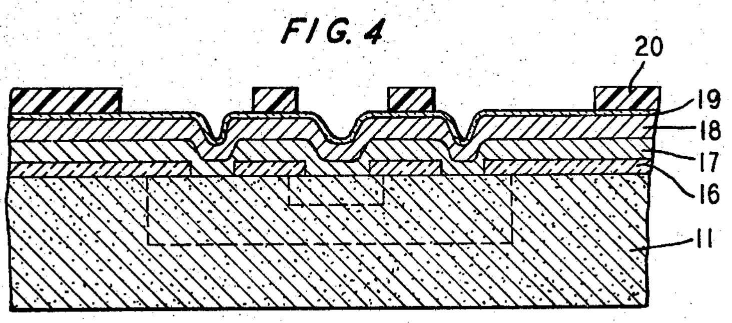

Reverting to procedures used in the prior art, the body 10 is then prepared for application of a photo-resist mask. In FIG. 4 the photoresist mask 20 is formed on the surface of the platinum oxide film 19. The mask 20 defines a pattern of the final metallic contacts.

Figure 5:
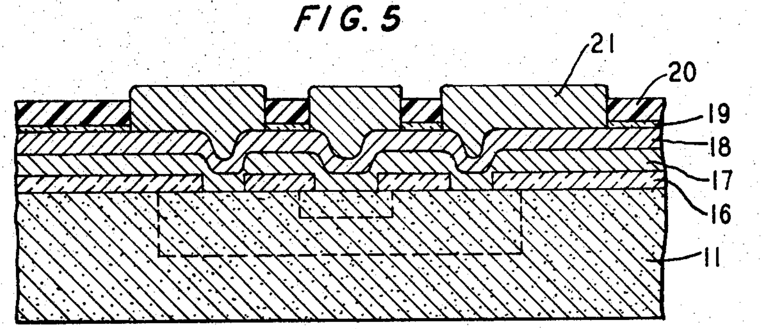

Referring to FIG. 5, gold contacts and interconnections 21 (about 1 to 2 micrometers) are formed by electrodeposition. The electrodeposition of gold onto the platinum layer 18 occurs only in those unmasked portions where the platinum oxide layer 19 is exposed. A separate operation for the removal of the exposed platinum oxide layer 19 prior to gold electrodeposition is unnecessary, as the exposed platinum oxide will be electrochemically reduced to metallic platinum in the gold plating solution before the deposition of gold commences. During this electrodeposition step, the presence of the platinum oxide layer 19 still masked by the photoresist film 20 constitutes a surface to which the photoresist film is quite adherent. Thus, penetration of the deposited gold under the photoresist film 20 is substantially inhibited, thereby preventing, for example, the possibility of short circuits.

For the electrodeposition of gold onto the exposed platinum oxide regions, any of the gold plating baths commonly known in the art may be used. For example, citrate, phosphate, and modified cyanide baths have all been used with success. A two-step mechanism in the gold deposition process is observed: (a) the exposed platinum oxide is first reduced to metallic platinum and (b) the gold is then electroplated onto the platinum thereby formed.

Figure 6:
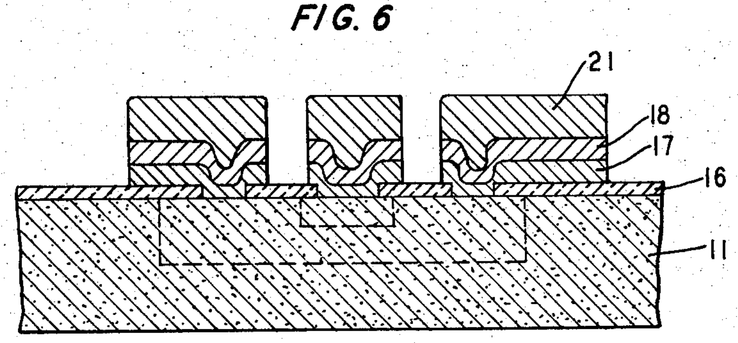

Finally, as depicted in FIG. 6, the device is shown following the removal of the photoresist layer 20 and the layers of platinum oxide 19, platinum 18, and titanium 17 outside the gold plated regions. The photo-resist layer is removed by means of a common commercially available solvent. Since platinum oxide is removed by methanol, the device may then be rinsed in methanol. The platinum layer, along with any remaining platinum oxide, is next conveniently removed by backsputtering. The gold layer is not appreciably removed, however, due to its greater thickness. The titanium layer is then removed by use of a chemical etchant, such as an aqueous solution of sulfuric acid and hydrofluoric acid.

It should be noted that the invention applies to the broad class of devices as described, including semiconductor devices, capacitors, resistors, and the like, in which lack of adherence of a photoresist layer to platinum poses a potential problem of poor definition of contact surfaces as a result of underplating by gold. While current interest is focused on metallizing semiconductor surfaces (e.g., silicon, germanium, $III^A$–$V^A$ compounds), other surfaces may also be advantageously metallized in accordance with this invention, including insulators (e.g., silicon dioxide, silicon nitride, tantalum oxide, tantalum nitride, aluminum oxide).

(2) Oxidation of platinum

Oxidation of platinum is accomplished by two methods: anodic and chemical. In anodic oxidation, voltage is the critical parameter that must be controlled, while in chemical oxidation, oxidation potential is the critical parameter.

(a) Anodic oxidation: Anodic oxidation of platinum generates a layer of adsorbed oxygen on the surface of the platinum. While there is uncertainty as to whether the adsorbed oxygen layer reacts chemically to produce a platinum oxide or is only physically adsorbed on the platinum surface, it has been established that oxygen, under anodic polarization, begins to adsorb at about 0.8 volt. (See James P. Hoare, The Electrochemistry of Oxygen, Interscience Publishers, New York (1968), pp. 39–41.) In any event, the resulting stable layer of adsorbed oxygen forms a surface to which an organic photoresist is sufficiently adherent to inhibit underplating during gold electrodeposition; this layer is herein referred to as the platinum oxide layer.

Platinum is oxidized in accordance with the invention by anodizing to at least 0.8 volt. The anodization may be performed either by operating at such voltage for a period of time or by operating at a current density such that this voltage is attained. The conditions of voltage potential, time, and current density are selected so as to ensure the formation of a complete oxide layer within a reasonable amount of time. Thus, below a potential of about 0.8 volt, the oxide layer does not form at all, while, at a potential greater than 1.6 volts, higher oxides such as $ptO_2$ are formed, which are undesirable, since they tend to be more difficult to remove prior to gold plating.

It may be desirable to control the current density, rather than the voltage, during anodization. In such cases, the same voltage limitations described above apply. If the anodizing current density is too low, the platinum oxide layer is not formed within a reasonable amount of time; while if the current density is too high, higher oxides are again formed. For the practice of the invention, a suitable range in current density is 0.1 to 10 milliamperes per square centimeter. This range ensures that the minimum voltage of 0.8 volt is attained within a few seconds.

It takes at least ten seconds at about 0.8 volt to form a sufficient surface layer of the oxide to satisfy the requirement. It is postulated that any additional time is used in diffusing oxygen into platinum to form a platinum-oxygen solid solution. Such additional time is advantageous, as it ensures improved adherence of the photoresist layer. Too long a period of time, however, results in an unnecessary consumption of time in diffusing excess oxygen into the platinum layer. Thus, an acceptable period of time for the practice of the invention is on the order of a few minutes, and a practical maximum period of time is ten minutes.

Aqueous electrolytic solutions that generate oxygen at the anode and do not themselves oxidize prior to the formation of the oxide layer, must be employed in the anodization of platinum. Examples of such solutions include sulfuric acid ($H_2SO_4$), potassium hydroxide (KOH) and perchlorate salts ($ClO_4^-$).

For a more complete discussion of the anodization of platinum, the practitioner is referred to Hoare, cited above, especially to pages 13–46.

(b) Chemical oxidation: Commonly known strong oxidizing agents may also be used to form the platinum oxide layer in accordance with the invention. Such oxidizing agents must have an oxidation potential of at least −0.80 volt relative to the standard hydrogen half-cell reaction:

$$H_2=2H^++2e^-\ (0.00\ \text{volt})$$

Examples of oxidizing agents useful in the practice of the invention are as follows:

(1) nitric acid ($HNO_3$):

$$N_2O_4+2H_2O=2NO_3^-+4H^++2e^-\ (-0.80\ \text{volt})$$

or $$HNO_2+H_2O=NO_3^-+3H^++2e^-\ (-0.94\ \text{volt})$$

(2) perchloric acid ($HClO_4$):

$$ClO_3^-+H_2O=ClO_4^-+2H^++2e^-\ (-1.10\ \text{volts})$$

(3) chromic acid ($H_2CrO_4$) and acid solutions of potassium dichromate ($K_2Cr_2O_7$):

$$2Cr^{3+}+7H_2O=Cr_2O_7^{2-}+14H^++6e^-\ (-1.33\ \text{volts})$$

(4) acid solutions of ceric sulfate ($Ce(SO_4)_2$):

$$Ce^{3+}=Ce^{4+}+e^-\ (-1.61\ \text{volts})$$

These values are taken from Wendell M. Latimer, Oxidation Potentials, 2nd ed., Prentice-Hall, Inc., New York (1952).

These oxidants perform best when used at elevated temperatures. The platinum should be immersed for at least ten seconds; longer times, such as five minutes, are recommended to produce a relatively thick reproducible platinum oxide layer.

Chemical oxidants weaker than those listed above, such as 30% hydrogen peroxide ($H_2O_2$) do not produce an adequate platinum oxide layer to which the photoresist is sufficiently adherent for the practice of the invention.

(3) Examples (a) A number of silicon integrated circuit chips were metallized in accordance with the invention. Prior to electrodeposition of gold onto platinum regions defined by a photoresist pattern, the entire platinum surface on each chip was anodized to a final voltage of 1.6 volts for five minutes at a current density of 0.2 milliamp per square centimeter in one normal sulfuric acid $$(1\ N\ H_2SO_4)$$

Following anodization of the platinum layer, the samples were rinsed in distilled water and coated with photoresist. These samples were compared with other samples prepared by the conventional method taught by Lepselter. Microscopic examination indicated that the adherence was greatly improved on those samples in which the platinum had been anodized; this was observed by noting that for the same period of gold plating time in both sets of samples, underplating of gold under the photoresist was reduced by more than 50% in the platinum anodized samples.

(b) Comparison of chips oxidized in hot (70° C.) commercially available concentrated (70% by volume) nitric acid for five minutes with chips prepared by the Lepselter method gave similar results as obtained above.

While these results do not necessarily signify that the spacing between electrode surfaces, currently 0.007 inch, can now be reduced by 50%, these results do indicate that there is considerably less likelihood that the electrode surfaces will be short-circuited by underplating.

What is claimed is:

1. A method for producing a conductive electrode pattern, which comprises depositing a photoresist mask layer onto a platinum surface, removing portions of the photoresist mask layer to define the conductive electrode pattern, and depositing a gold layer onto the platinum surface, characterized in that prior to the deposition of the photoresist mask layer, the platinum surface is oxidized to produce an oxygen-containing layer.

2. The method of claim 1 in which the platinum surface is a platinum layer deposited on a substrate.

3. The method of claim 2 in which the platinum layer is deposited on a titanium surface.

4. The method of claim 1 in which the oxidation is performed by anodization for a time of at least 10 seconds at a voltage of from 0.8 to 1.6 volts, in which the maximum voltage attained is 1.6 volts.

5. The method of claim 4 in which the voltage initially is less than the minimum voltage of 0.8 volt.

6. The method of claim 5 in which the anodization is carried out at a substantially constant current density, ranging from 0.1 to 10 milliamperes per square centimeter.

7. The method of claim 4 in which the platinum layer is anodized in an aqueous electrolye.

8. The method of claim 1 in which the platinum layer is chemically oxidized in a chemical solution having an oxidation potential of at least −0.80 volt relative to the standard hydrogen half-cell reaction.

References Cited

UNITED STATES PATENTS

| | | | |
|---|---|---|---|
| 3,514,379 | 5/1970 | Neill | 204—15 |
| 3,287,612 | 11/1966 | Lepselter | 317—235 |
| 3,388,048 | 6/1968 | Szabo | 204—15 |
| 3,507,756 | 4/1970 | Wenger | 204—15 |

FOREIGN PATENTS

| | | |
|---|---|---|
| 1,211,657 | 11/1970 | Great Britain. |

OTHER REFERENCES

The Electrochemistry of Oxygen, by J. P. Hoare, 1968, Interscience Publishers, New York, pp. 13–46.

JOHN H. MACK, Primary Examiner

T. TUFARIELLO, Assistant Examiner

U.S. Cl. X.R.

204—42